(12) United States Patent
Kawata et al.

(10) Patent No.: US 10,211,233 B2
(45) Date of Patent: Feb. 19, 2019

(54) DISPLAY DEVICE

(71) Applicant: Japan Display Inc., Minato-ku (JP)

(72) Inventors: Yasushi Kawata, Tokyo (JP); Takumi Sano, Tokyo (JP)

(73) Assignee: Japan Display Inc., Minato-ku (JP)

( * ) Notice: Subject to any disclaimer, the term of this patent is extended or adjusted under 35 U.S.C. 154(b) by 95 days.

(21) Appl. No.: 15/366,131

(22) Filed: Dec. 1, 2016

(65) Prior Publication Data
US 2017/0179159 A1    Jun. 22, 2017

(30) Foreign Application Priority Data
Dec. 16, 2015  (JP) .................. 2015-245374

(51) Int. Cl.
| | | |
|---|---|---|
| G02F 1/1345 | (2006.01) | |
| G02F 1/1362 | (2006.01) | |
| G02F 1/1368 | (2006.01) | |
| G02F 1/1335 | (2006.01) | |
| G02F 1/1333 | (2006.01) | |
| H01L 27/12 | (2006.01) | |
| H01L 23/552 | (2006.01) | |
| H01L 27/32 | (2006.01) | |

(52) U.S. Cl.
CPC ........ H01L 27/124 (2013.01); G02F 1/13452 (2013.01); H01L 23/552 (2013.01); H01L 27/1218 (2013.01); G02F 1/1368 (2013.01); G02F 1/13458 (2013.01); G02F 1/133512 (2013.01); G02F 1/136209 (2013.01); G02F 2001/13685 (2013.01); G02F 2001/133302 (2013.01); G02F 2201/42 (2013.01); H01L 27/3272 (2013.01); H01L 27/3276 (2013.01)

(58) Field of Classification Search
CPC .................................................. G02F 1/13452
See application file for complete search history.

(56) References Cited

U.S. PATENT DOCUMENTS

| | | | |
|---|---|---|---|
| 6,690,032 B1 * | 2/2004 | Umetsu | G02F 1/1345 |
| | | | 257/621 |
| 2007/0040798 A1 * | 2/2007 | Kawai | G02F 1/167 |
| | | | 345/107 |

(Continued)

FOREIGN PATENT DOCUMENTS

| | | |
|---|---|---|
| JP | 10-104651 | 4/1998 |
| JP | 10-189863 | 7/1998 |

(Continued)

*Primary Examiner* — Alexander Gross
(74) *Attorney, Agent, or Firm* — Oblon, McClelland, Maier & Neustadt, L.L.P.

(57) ABSTRACT

According to one embodiment, a display device includes a first substrate including a support substrate, a light shield, an insulating substrate disposed above the support substrate and the light shield and including a through hole, a pad electrode formed above the insulating substrate, and a signal line electrically connected to the pad electrode, and a first substrate including, in a plan view, a first area in which the support substrate and the light shield are disposed and a second area in which the through hole is disposed, a line substrate including a connection line and disposed below the insulating substrate, and a conductive material disposed inside the through hole to electrically connect the pad electrode and the connection line.

13 Claims, 12 Drawing Sheets

(56) References Cited

U.S. PATENT DOCUMENTS

| | | | |
|---|---|---|---|
| 2007/0117238 A1* | 5/2007 | Oh | G02F 1/1368 438/30 |
| 2010/0134398 A1* | 6/2010 | Toyota | G02F 1/1368 345/92 |
| 2011/0007233 A1* | 1/2011 | Matsui | G02F 1/1337 349/43 |
| 2013/0128192 A1* | 5/2013 | Ishikawa | G02F 1/133512 349/96 |
| 2013/0342779 A1* | 12/2013 | Jung | G02B 6/0083 349/43 |
| 2014/0063393 A1* | 3/2014 | Zhong | G02F 1/13306 349/42 |
| 2014/0361183 A1 | 12/2014 | Takeda et al. | |
| 2017/0179164 A1* | 6/2017 | Choi | G02F 1/133345 |

FOREIGN PATENT DOCUMENTS

| | | |
|---|---|---|
| JP | 2009-237410 | 10/2009 |
| JP | 2014-236209 | 12/2014 |

* cited by examiner

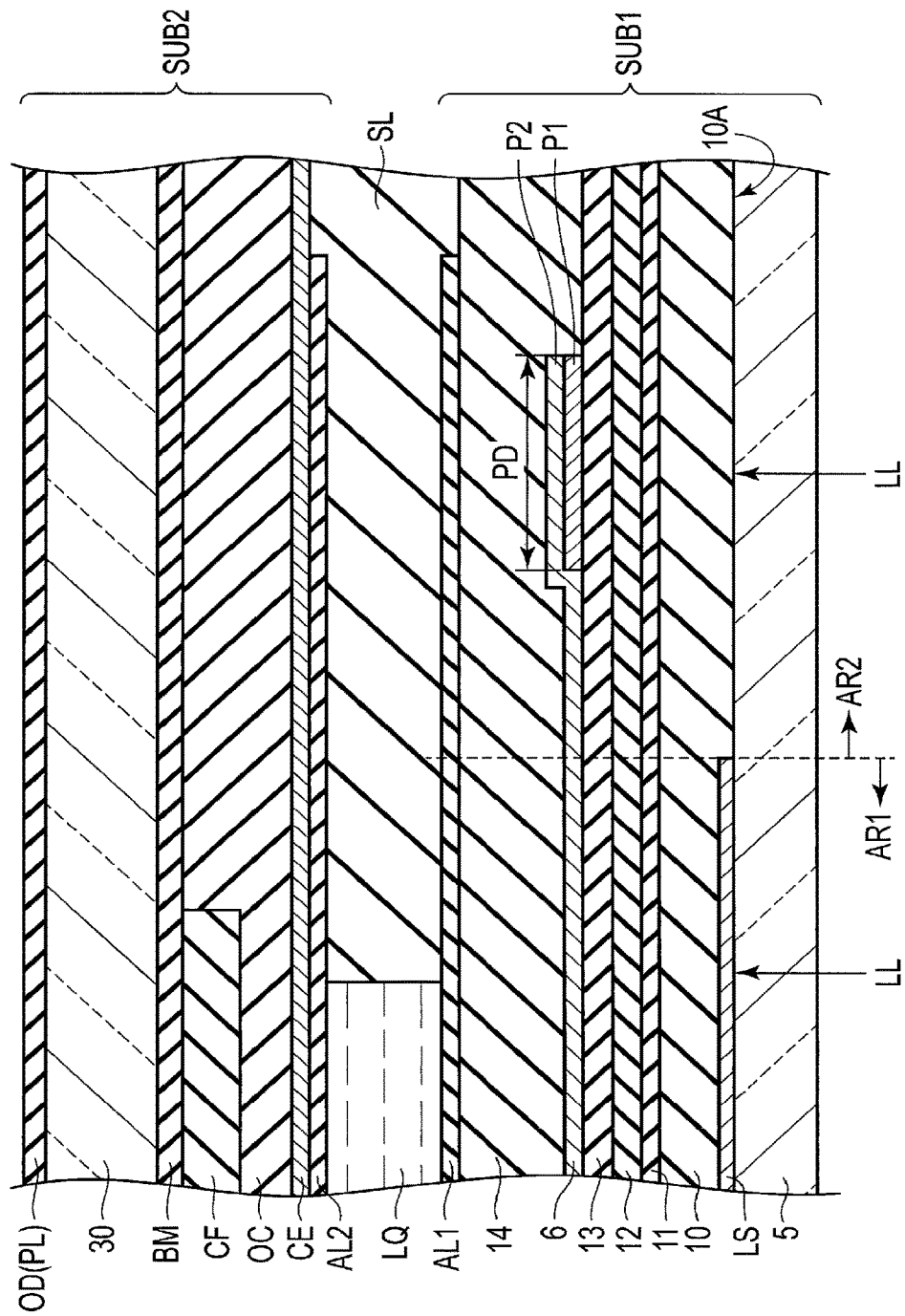
F I G. 6

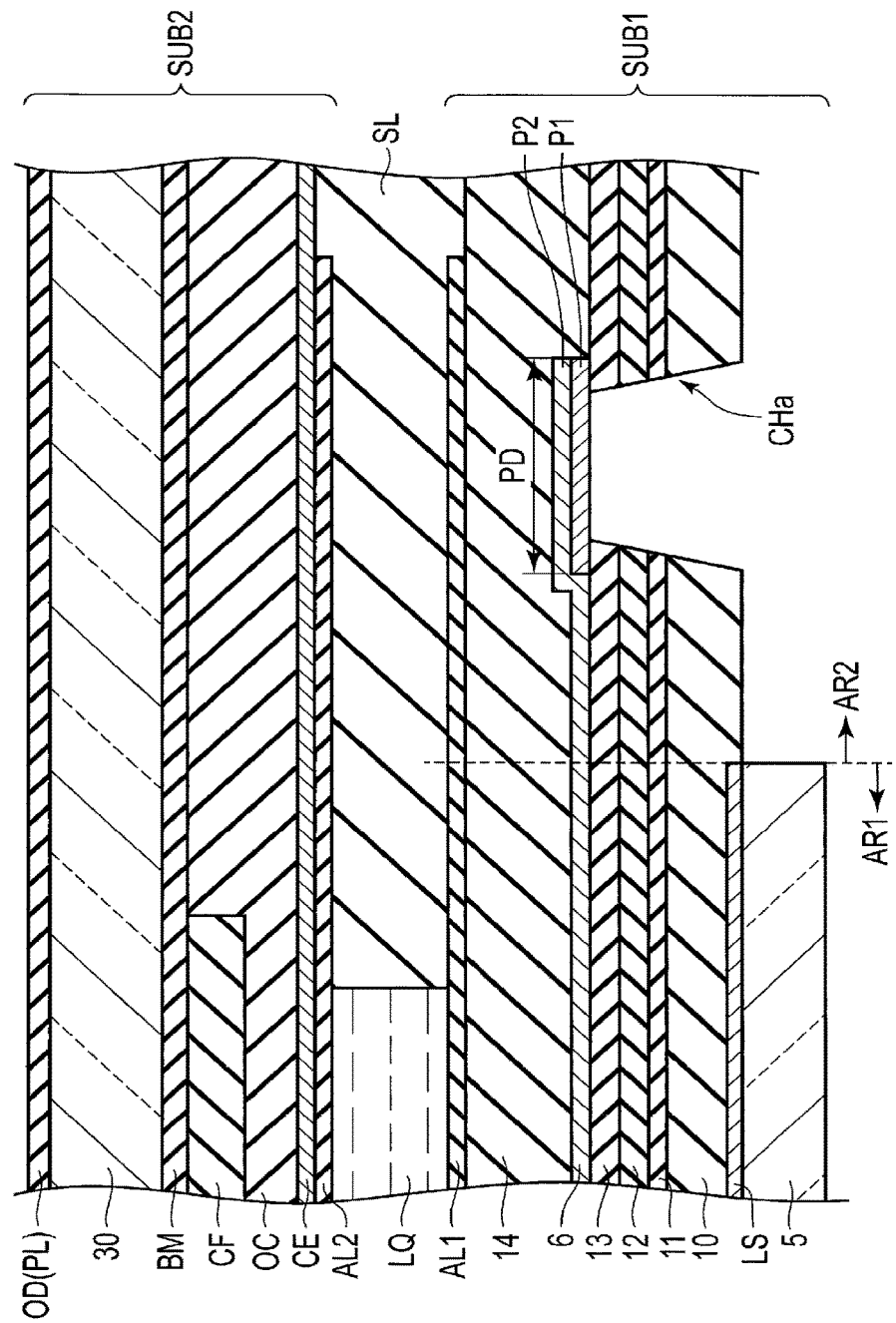
F I G. 8

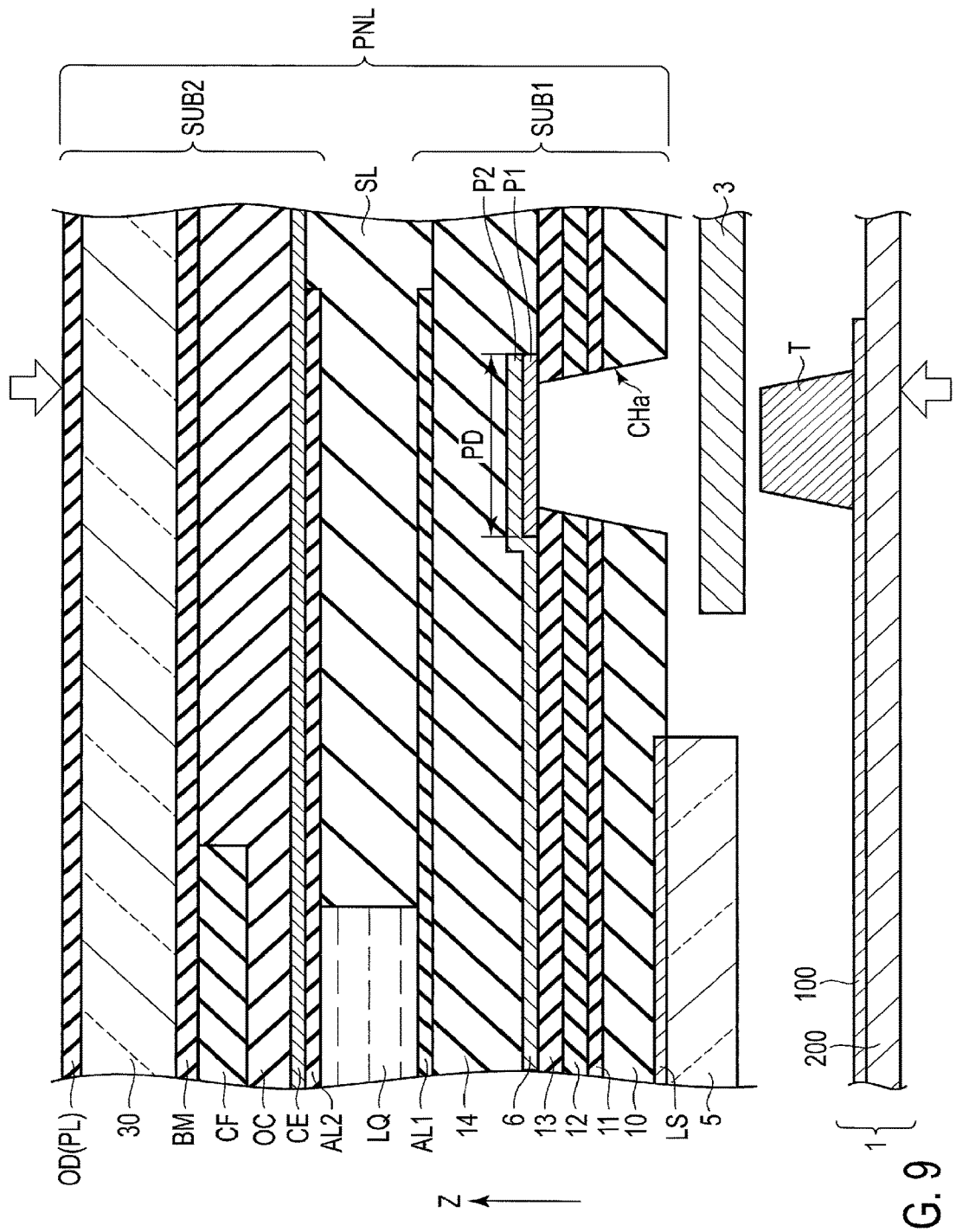
F I G. 9

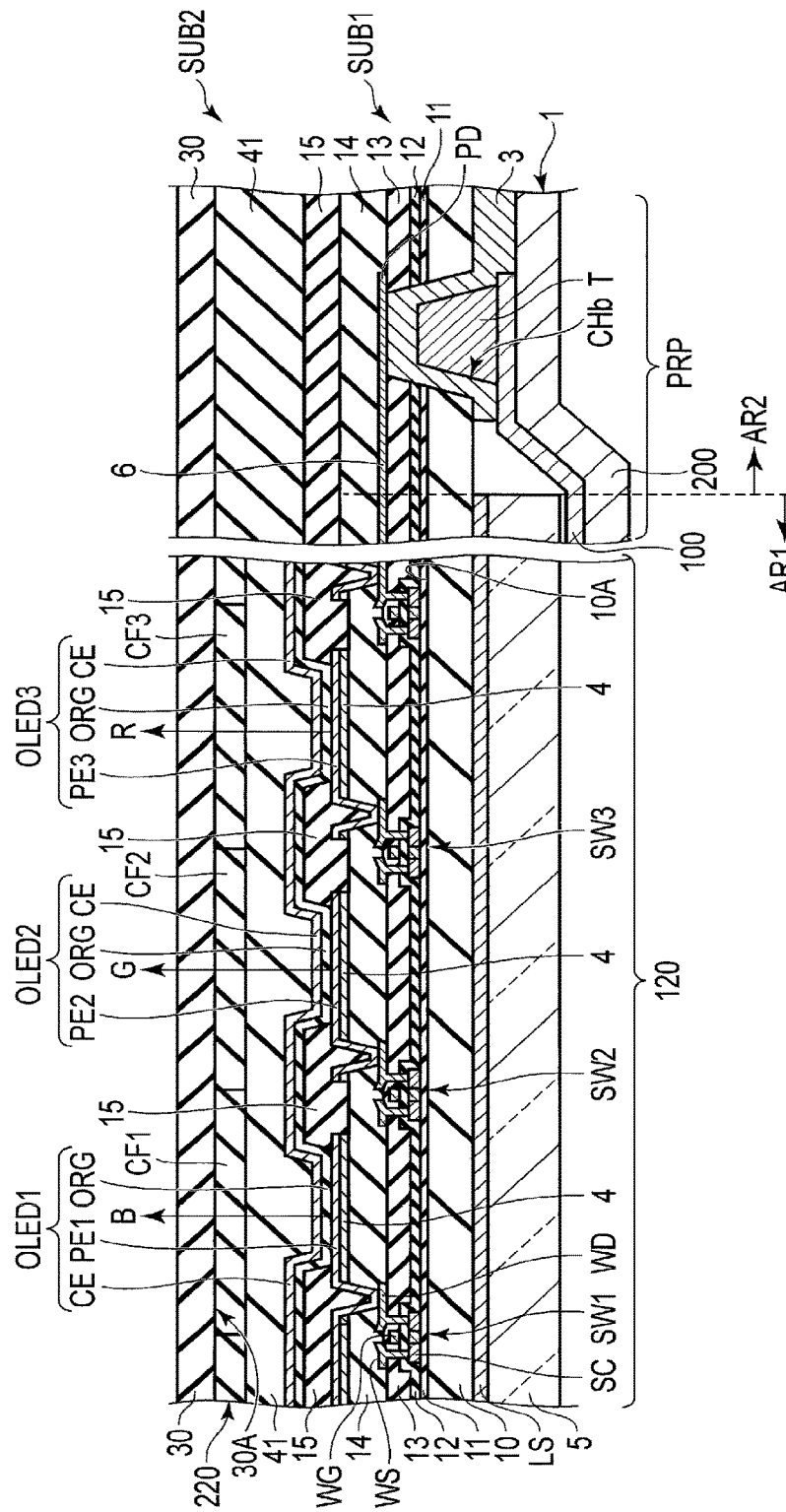
F I G. 10

DISPLAY DEVICE

CROSS-REFERENCE TO RELATED APPLICATIONS

This application is based upon and claims the benefit of priority from Japanese Patent Application No. 2015-245374, filed Dec. 16, 2015, the entire contents of which are incorporated herein by reference.

FIELD

Embodiments described herein relate generally to a display device.

BACKGROUND

In recent years, display devices with a greater display area on the surface are highly anticipated because of higher performance and advanced design in the technical field of mobile data communication devices such as mobile phone and personal digital assistant (PDA). For example, display devices including a thinner bezel structure are proposed.

Conventionally, there is a well-known structure in which a driver is mounted in the periphery of the display area on the substrate including electrodes. In display devices using such a structure of the driver, input signals and voltages are supplied to the driver through a line substrate such as a flexible printed circuit (FPC). However, in consideration of greater production and thinner bezel structure, there has been a study to omit such a flexible printed circuit but to achieve an electrical connection between lines formed on the lower surface side of an array substrate and the driver formed on the upper surface side of the array substrate through a contact hole passing through the array substrate.

BRIEF DESCRIPTION OF THE DRAWINGS

FIG. 6 is a cross-sectional view showing a first process in which a first substrate including the support substrate and a second substrate are adhered together.

FIG. 8 is a cross-sectional view showing a third process in which a contact hole is formed in the first substrate after the second process of FIG. 7.

FIG. 9 is a cross-sectional view showing a fourth process in which the line substrate is pressed to the liquid crystal display panel after the third process of FIG. 8.

FIG. 10 is a cross-sectional view of a variation of the display device of the embodiment.

DETAILED DESCRIPTION

Figure 1:
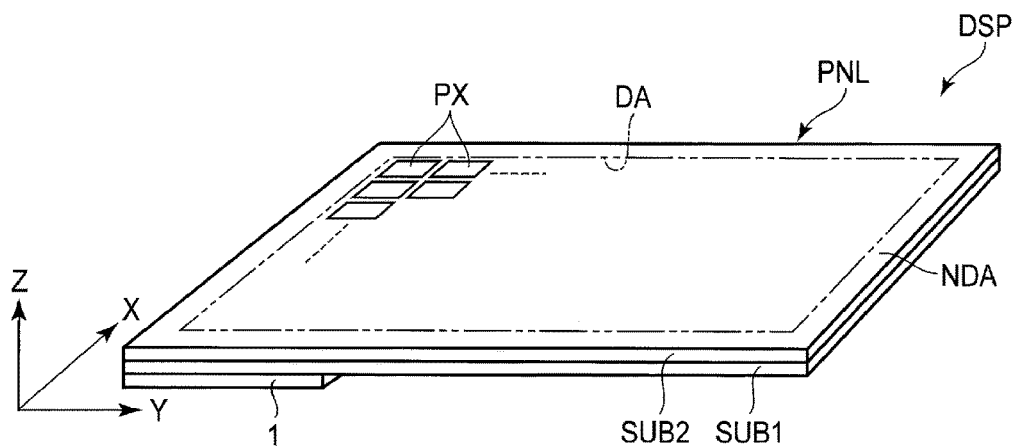
FIG. 1 is a schematic perspective view of the structure of a display device of an embodiment.

In general, according to one embodiment, a display device comprising: a first substrate including a support substrate, a light shield, an insulating substrate disposed above the support substrate and the light shield and including a through hole, a pad electrode formed above the insulating substrate, and a signal line electrically connected to the pad electrode, and a first substrate including, in a plan view, a first area in which the support substrate and the light shield are disposed and a second area in which the through hole is disposed; a line substrate including a connection line and disposed below the insulating substrate; and a conductive material disposed inside the through hole to electrically connect the pad electrode and the connection line.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc. of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless necessary.

Firstly, a display device of a present embodiment will be explained. FIG. 1 is a schematic perspective view showing the structure of a display device DSP of the present embodiment. FIG. 1 shows a three-dimensional space which is defined by a first direction X, second direction Y which is orthogonal to the first direction X, and third direction Z which is orthogonal to the first direction X and the second direction Y. Note that, in this example, the first direction X and the second direction Y are orthogonal to each other; however, they may cross at an angle other than 90°. Furthermore, in the present embodiment, the display device is a liquid crystal display device.

As shown in FIG. 1, the display device DSP includes a liquid crystal display panel PNL of active matrix type and a line substrate 1. The liquid crystal display panel PNL includes a plate-like first substrate SUB1, plate-like second substrate SUB2 opposed to the first substrate SUB1, and liquid crystal layer (liquid crystal layer LQ which will be described later) interposed between the first substrate SUB1 and the second substrate SUB2. Note that the liquid crystal display panel PNL of the present embodiment is a reflective-type liquid crystal display panel.

In the present embodiment, the positive direction of the third direction Z, that is, a direction from the first substrate SUB1 toward the second substrate SUB2 is defined as up or above, and the negative direction of the third direction Z, that is, a direction from the second substrate SUB2 toward the first direction SUB1 is defined as down or below.

The liquid crystal display panel PNL includes a display area DA in which an image is displayed and a non-display area NDA which surrounds the display area DA. The liquid crystal display panel PNL includes a plurality of pixels PX within the display area DA. The pixels PX are arranged in a matrix in the first direction X and the second direction Y.

In the example depicted, a side edge of the first substrate SUB1 which is parallel to the first direction X and a side edge of the second substrate SUB2 which is parallel to the first direction X have a substantially same length. Furthermore, a side edge of the first substrate SUB1 which is parallel to the second direction Y and a side edge of the second substrate SUB2 which is parallel to the second direction Y have a substantially same length. That is, an area of the first substrate SUB1 which is parallel to the X-Y plane is substantially the same as an area of the second substrate SUB2 in the X-Y plane. In the present embodiment, each side edge of the first substrate SUB1 matches each corresponding edge of the second substrate SUB2 in the third direction Z.

The line substrate 1 is disposed below the liquid crystal display panel PNL. In this example, a side edge of the line substrate 1 which is parallel to the first direction X has a length shorter than or equal to the side edges of the first substrate SUB1 and the second substrate SUB2 which are parallel to the first direction X. Furthermore, a side edge of the line substrate 1 which is parallel to the second direction Y has a length shorter than or equal to the side edges the first substrate SUB1 and the second substrate SUB2 which are parallel to the second direction Y. The line substrate 1 is disposed in both the non-display area NDA and the display area DA. In the present embodiment, a side edge of the line substrate 1 which is parallel to the first direction X matches an end of the liquid crystal display panel PNL in the third direction Z. Note that the line substrate 1 does not go outside the area opposed to the liquid crystal display panel PNL. The liquid crystal display panel PNL and the line substrate 1 are electrically connected to each other.

Figure 2:
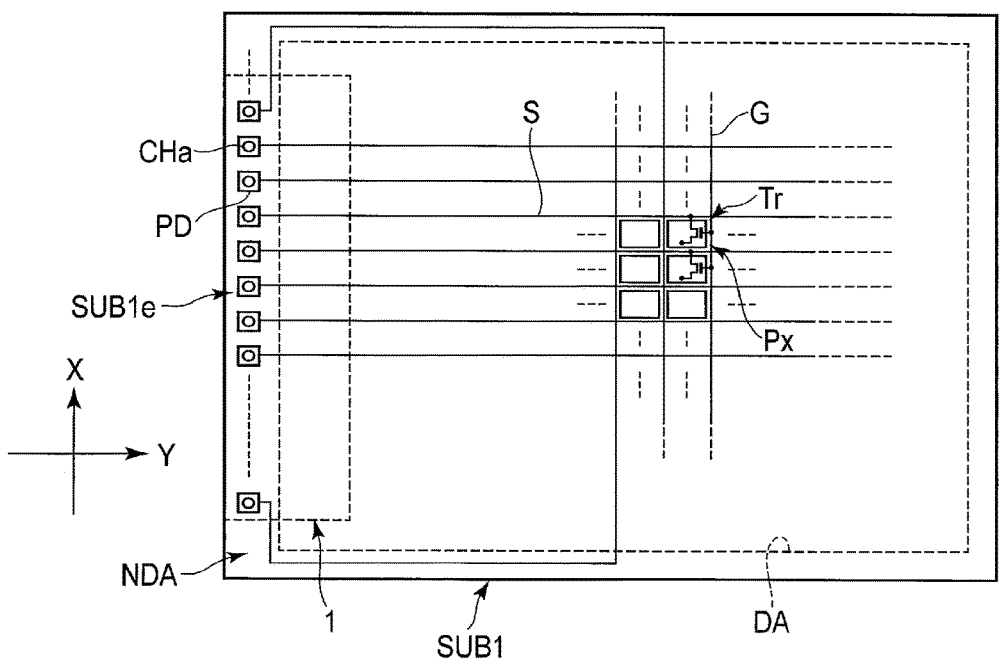
FIG. 2 is a schematic plan view of the first substrate of the display device of FIG. 1.

FIG. 2 is a schematic plan view of the first substrate SUB1 of the display device DSP of FIG. 1. As shown in FIG. 2, the first substrate SUB1 includes, in the display area DA, a plurality of gate lines G extending in the first direction X and arranged in the second direction Y, a plurality of source lines S extending in the second direction Y and arranged in the first direction X, and a thin film transistor Tr which is electrically connected to a gate line G and a source line S in each pixel PX. Each pixel PX is defined by two adjacent gate lines G and two adjacent source lines S. The thin film transistor Tr functions as a switching element.

The first substrate SUB1 includes an edge SUB1e in the non-display area NDA, in which a plurality of pad electrodes PD and a plurality of contact holes CHa are formed. Each pad electrode PD is formed to overlap a corresponding contact hole CHa. Each of the source lines S and the gate lines G is drawn to the non-display area NDA and is electrically connected to a corresponding pad electrode PD. The line substrate 1 is formed to at least partially overlap the edge SUB1e of the first substrate SUB1 as depicted with the dotted line in the figure. The line substrate 1 is, as described later, electrically connected to the pad electrode PD through the conductive material (which is not shown) in the contact holes CHa.

Figure 3:
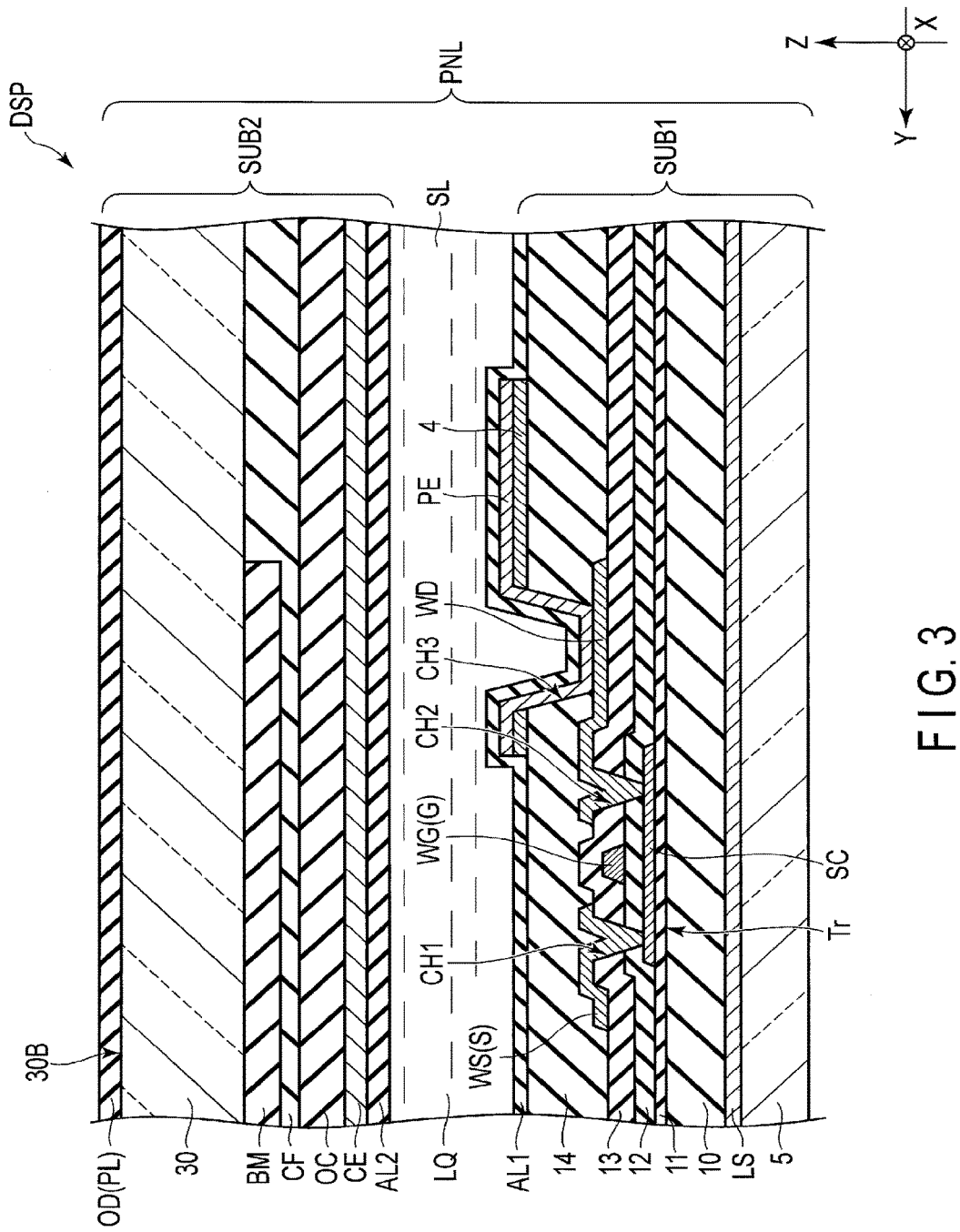
FIG. 3 is a cross-sectional view of a display area of the display device of FIG. 1.

FIG. 3 is a cross-sectional view of the display area DA of the display device DSP of FIG. 1. Note that the example depicted in FIG. 3 shows a reflective liquid crystal display device using a twisted nematic (TN) mode.

As shown in FIG. 3, the first substrate SUB1 includes, for example, a support substrate 5, light shield LS, first insulating substrate 10, thin film transistor Tr, reflective layer 4, pixel electrode PE, and first alignment film AL1. The support substrate 5 is, for example, a glass substrate. The light shield LS is disposed on the support substrate 5. The light shield LS shields a laser beam. In the present embodiment, the light shield LS is formed of a material which reflects a laser beam, that is, a metal material or the like, and such a metal material reflects excimer laser or the like. The first insulating substrate 10 is disposed above the support substrate 5 and the light shield LS. That is, the light shield LS is disposed between the support substrate 5 and the first insulating substrate 10. The first insulating substrate 10 is formed of an organic insulating material such as polyimide. The first insulating substrate 10 is covered with a first insulating film 11.

The thin film transistor Tr is disposed above the first insulating film 11. In the example depicted, the thin film transistor Tr is structured top-gate type; however, it may be formed bottom-gate type. The thin film transistor Tr includes a semiconductor layer SC formed on the first insulating film 11. The semiconductor layer SC is covered with a second insulating film 12. The second insulating film 12 is disposed above the first insulating film 11.

A gate electrode WG of the thin film transistor Tr is formed on the second insulating film 12 to be directly above the semiconductor layer SC. The gate electrode WG is electrically connected to a gate line G (or formed integrally with the gate line G) and is covered with a third insulating film 13. Furthermore, the third insulating film 13 is disposed above the second insulating film 12.

The first insulating film 11, second insulating film 12, and third insulating film 13 are formed of an inorganic material such as silicon oxide or silicon nitride.

A source electrode WS and a drain electrode WD are formed on the thin film transistor Tr. Furthermore, the source line S is formed on the third insulating film 13. The source electrode WS is electrically connected to the source line S (or formed integrally with the source line S). The source electrode WS and the drain electrode WD are electrically connected to the semiconductor layer SC through contact holes CH1 and CH2 passing through the second insulating film 12 and the third insulating film 13. The thin film transistor Tr is covered with a fourth insulating film 14. The fourth insulating film 14 is disposed above the third insulating film 13. The fourth insulating film 14 is formed of an organic material such as transparent resin.

The reflective layer 4 is formed on the fourth insulating film 14. The reflective layer 4 is formed of a highly reflective metal material such as aluminum and silver. Note that the surface of the reflective layer 4 (that is, the surface in the second substrate SUB2 side) has an asperity for light dispersion.

The pixel electrode PE is formed on the fourth insulating film 14, and in the example depicted, it overlaps the reflective layer 4. Note that the reflective layer 4 can be formed at any position as long as it is opposed to the pixel electrode PE, and a different insulating film may be interposed between the pixel electrode PE and the reflective layer 4. The pixel electrode PE contacts the drain electrode WD of the thin film transistor Tr through a contact hole CH3 which passes through the fourth insulating film 14. The pixel electrode PE is formed of a transparent conductive material such as indium tin oxide (ITO) or indium zinc oxide (IZO). The pixel electrode PE is covered with the first alignment film AL1.

On the other hand, the second substrate SUB2 is disposed above the first substrate SUB1 and is opposed to the first substrate SUB1. The second substrate SUB2 includes, for example, a second insulating substrate 30, light shielding layer BM, color filter CF, overcoat layer OC, common electrode CE, second alignment film AL2. The second insulating substrate 30 is formed of a light transmissive material such as a glass substrate or a resin substrate.

The light shielding layer BM is formed on the second insulating substrate 30 to be opposed to the first substrate SUB1. The light shielding layer BM is formed to define each pixel PX to be opposed to the gate line G, and the source line S of the first substrate SUB1, the lines of the thin film transistor Tr, and contact hole CH3. The light shielding layer BM is formed of a light shielding metal material or a black resin material.

The color filter CF is formed on the second insulating substrate 30 to be opposed to the first substrate SUB1 and partly overlaps the light shielding layer BM. Color filters CF are formed of resin materials of different colors such as red, blue; and green. A red color filter corresponds to a red pixel, a green color filter corresponds to a green color pixel, and a blue color filter corresponds to a blue color pixel. Note that color filters CF may further include a white or a transparent color filter. Each boundary between color filters CF of different colors is disposed to be opposed to a light shielding layer BM.

The overcoat layer OC covers the color filter CF. The overcoat layer OC is formed of a transparent resin material.

The common electrode CE is formed on the overcoat layer OC to be opposed to the first substrate SUB1. The common electrode is formed of a transparent conductive material such as ITO or IZO. The common electrode CE is covered with the second alignment film AL2.

In the above-explained relationship of the first substrate SUB1 and the second substrate SUB2, the first alignment film AL1 and the second alignment film AL2 are disposed to be opposed to each other. Therein, a certain cell gap is formed between the first substrate SUB1 and the second substrate SUB2 with spacers (which are not shown). The first substrate SUB1 and the second substrate SUB2 are adhered together by a sealant (which is not shown) with a cell gap formed therebetween. The liquid crystal layer LQ is sealed within the first alignment film AL1 and the second alignment film AL2. An optical element OD including a polarizer PL is disposed on the external surface 30B of the second insulating substrate 30. The optical element OD is disposed on the display surface side.

Figure 4:
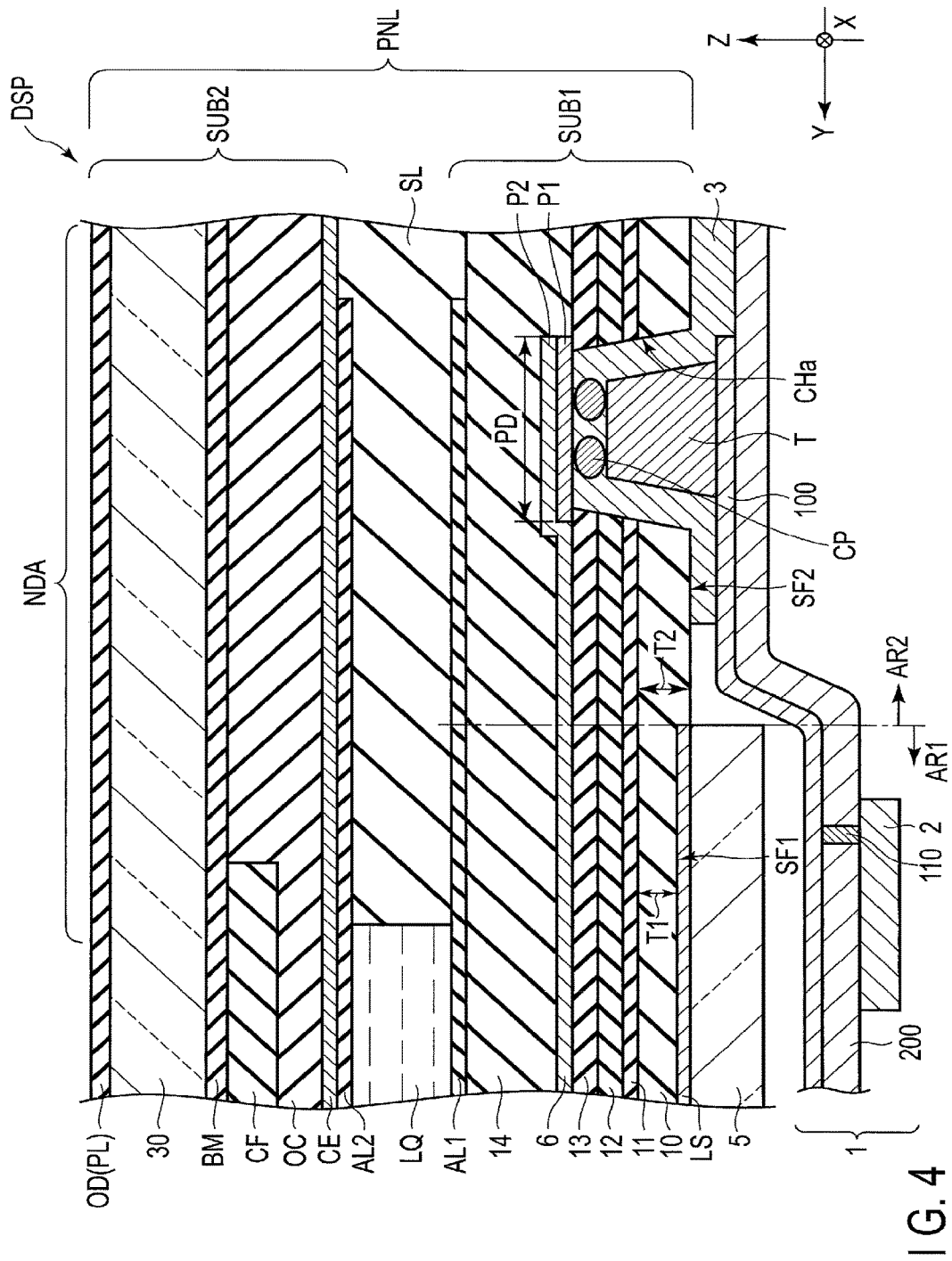
FIG. 4 is a cross-sectional view of the display device of FIG. 1 including a non-display area.

FIG. 4 is a cross-sectional view of the display device DSP of FIG. 1 including the non-display area NDA. Note that the second substrate SUB2 here is structured substantially the same as the second substrate SUB2 of FIG. 3, and the detailed description thereof will be omitted. Furthermore, a view of the first substrate SUB1 from the second substrate SUB2 side is defined as a plan view.

As shown in FIG. 4, the first substrate SUB1 and the second substrate SUB2 are adhered by a sealant SL. The liquid crystal layer LQ is disposed between the first substrate SUB1 and the second substrate SUB2 inside the area surrounded by the sealant SL. The sealant SL is formed in the non-display area NDA.

The support substrate 5 and the light shield LS do not extend to the edge of the first substrate SUB1 and are cut halfway. That is, the support substrate 5 and the light shield LS do not extend to the side edge of the first substrate SUB1 in the edge SUB1e side, which is shown in FIG. 2. Here, the first substrate SUB1 includes a first area AR1 and a second area AR2. The first area AR1, in a plan view, corresponds to the area where the support substrate 5 and the light shield LS are disposed, and the second area AR2, in a plan view, corresponds to the area where the support substrate 5 and the light shield LS are not disposed. The light shield LS contacts the support substrate 5 and the first insulating substrate 10 in the first area AR1. The first insulating substrate 10 has a thickness T1 in the first area AR1 and a thickness T2 in the second area AR2. In the example depicted, the thickness 11 is less than the thickness T2. The support substrate 5 and the light shield LS overlap a part of the sealant SL in a plan view. The sealant SL is formed over the boundary of the first area AR1 and the second area AR2.

The pad electrode PD is formed above the first insulating substrate 10. In the example depicted, the first insulating film 11, second insulating film 12, and third insulating film 13 are disposed between the pad electrode PD and the first insulating substrate 10. Furthermore, in the example depicted, the pad electrode PD is a multilayer including electrodes P1 and P2. The electrode P1 is formed of, for example, indium tin oxide. The electrode P2 is disposed above the electrode P1 and is formed of, for example, a metal material. The electrode P2 is formed in, for example, an island shape. A contact hole CHa is formed passing through the first insulating substrate 10, first insulating film 11, second insulating film 12, and third insulating film 13 to reach the pad electrode PD. The pad electrode PD is formed in a position opposed to the contact hole CHa. The pad electrode PD and the contact hole CHa are, in a plan view, formed in the second area AR2 of the first substrate SUB1. Furthermore, the contact hole CHa is, in a plan view, formed at a position overlapping the sealant SL. Note that, in the present embodiment, the contact hole CHa corresponds to a through hole passing through the first insulating substrate 10, first insulating film 11, second insulating film 12, and third insulating film 13 to reach the pad electrode PD.

The signal line 6 is, in the example depicted, formed on the third insulating film 13 and is formed in the same layer where the pad electrode PD is disposed. The signal line 6 is electrically connected to the pad electrode PD. The signal line 6 and the pad electrode PD may be formed separately or integrally. In the example depicted, the signal line 6 is formed integrally with the electrode P2 of the pad electrode PD. The signal line 6 corresponds to the gate line G and source line S of FIG. 2, a power source line, and various control lines. The fourth insulating film 14 covers the signal line 6, pad electrode PD, and third insulating film 13.

Note that, in the example depicted, the signal line 6 and the pad electrode PD are disposed in the same layer where the source line S is disposed; however, they may be disposed in a different layer. Furthermore, the signal line 6 and the pad electrode PD may be formed in different layers such that the signal line 6 and the pad electrode PD are electrically connected through a contact hole formed in an interlayer insulating film therebetween.

The line substrate 1 includes a core substrate 200, a connection line 100 disposed on the surface of the core substrate 200 to be opposed to the liquid crystal display panel PNL, and driver 2 disposed on the surface opposite to the surface of the core substrate 200 to be opposed to the liquid crystal display panel PNL.

The connection line 100 includes a projection T. The projection T of the connection line 100 is formed in a position to overlap the contact hole CHa in a plan view. At least a part of the projection T is formed in the contact hole CHa. The projection T is, for example, formed on the connection line 100 through a plating method.

The driver 2 is electrically connected to the connection line 100 through a through hole 110 formed in the core substrate 200. The driver 2 functions as, for example, a signal supplier which supplies a signal to the liquid crystal display panel PNL for its drive. Note that the position of the driver 2 is not limited to the above, and it may be disposed on the surface of the core substrate 200 which is opposed to the liquid crystal display panel PNL.

The liquid crystal display panel PNL and the line substrate 1 are electrically connected and adhered together with an anisotropy conductive film 3 which is a conductive material. Specifically, the anisotropy conductive film 3 includes conductive particles CP dispersed in an adhesive agent. When the anisotropy conductive film 3 is interposed between the line substrate 1 and the liquid crystal display panel PNL, they are pressed vertically in the third direction Z and heated to achieve electrical and physical connection therebetween. The anisotropy conductive film 3 is, between the liquid crystal display panel PNL and the line substrate 1, filled inside the contact hole CHa from the lower surface of the first insulating substrate 10 to contact the electrode P1 of the pad electrode PD. Furthermore, the anisotropy conductive film 3 contacts the projection T of the connection line 100. Thereby, the connection line 100 is electrically connected to the pad electrode PD and the signal line 6 through the anisotropy conductive film 3.

Specifically, the conductive particles CP in the anisotropy conductive film 3 are, in the contact hole CHa, interposed between the pad electrode PD and the projection T. With the projection T of the connection line 100, when the line substrate 1 is pressed to the liquid crystal display panel PNL, the conductive particles CP are crushed between the pad electrode PD and the projection T to establish electrical connection therebetween. The conductive particles CP may be entirely formed of a metal material or may be formed of a resin material with metal coating of nickel or gold.

Furthermore, the sealant SL is, in a plan view, formed in a position overlapping the contact hole CHa. Therefore, the sealant SL disposed as above is effective for firm connection between the line substrate 1 and the liquid crystal display panel PNL. Note that the lower surface SF1 of the first insulating substrate 10 in the first area AR1 contacts the light shield LS and the lower surface SF2 of the first insulating substrate 10 in the second area AR2 contacts the anisotropy conductive film 3.

Figure 5:
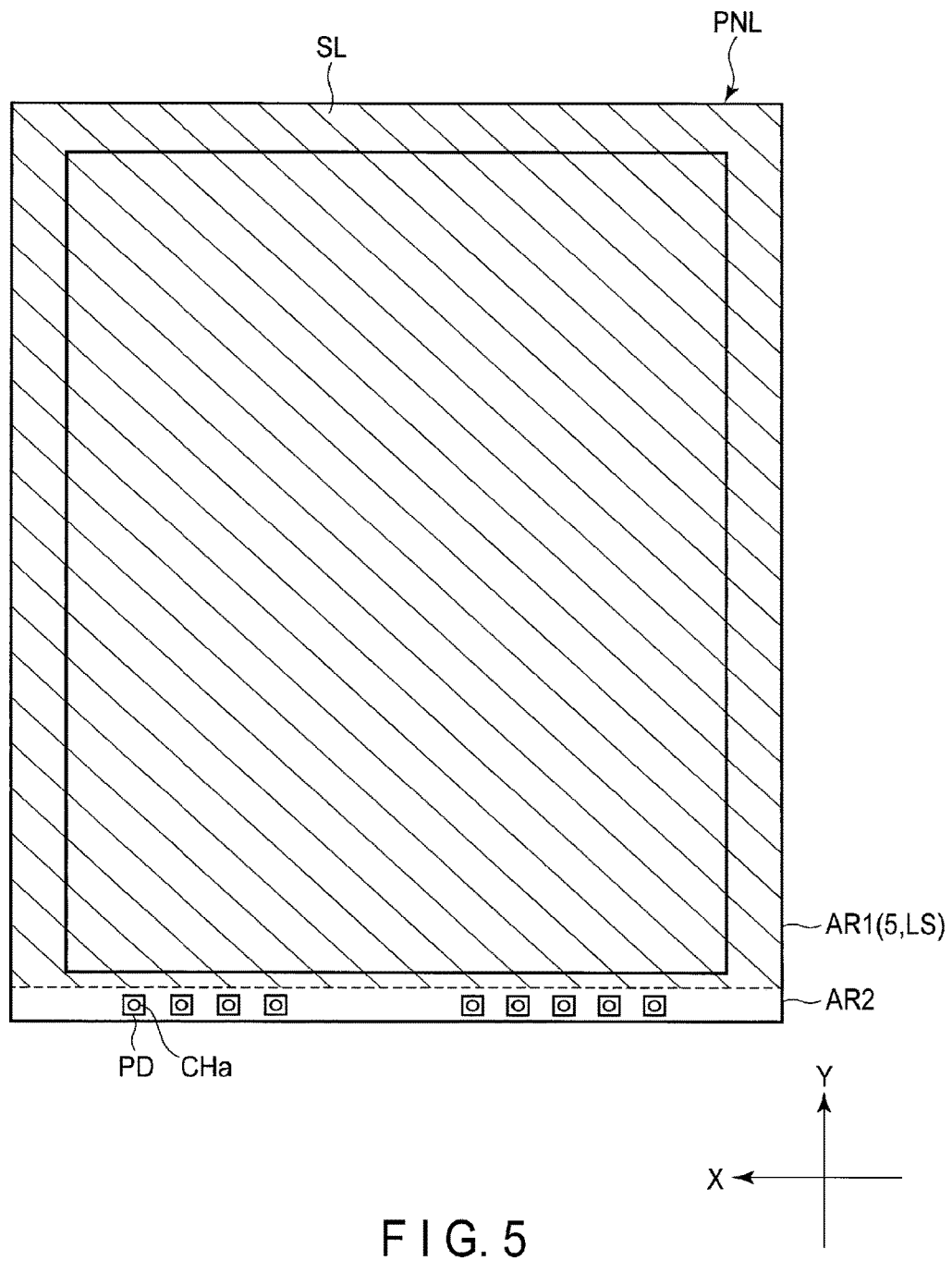
FIG. 5 is a plan view of a liquid crystal display panel, which shows positions of a support substrate and a light shield.

FIG. 5 is a plan view of the liquid crystal display panel PNL, which shows positions of the support substrate 5 and the light shield LS.

In FIG. 5, the first area AR1 is hatched. The support substrate 5 and the light shield LS are disposed over the entirety of the first area AR1. The pad electrode PD and the contact hole CHa are disposed in the second area AR2. The support substrate 5 and the light shield LS overlap, in a plan view, the pad electrode PD and the sealant SL in the contact hole CHa side.

Then, a manufacturing method of the display device DSP of the present embodiment will be explained with reference to FIGS. 6 to 9. FIGS. 6 to 9 are schematic cross-sectional views each showing a method of pressing the line substrate 1 to the liquid crystal display panel PNL in the present embodiment. The structure above the pad electrode PD shown in FIGS. 6 to 9 is the same as that of the liquid crystal display panel PNL of FIG. 4.

FIG. 6 is a cross-sectional view showing a first process in which the first substrate SUB1 including the support substrate 5 and the second substrate SUB2 are adhered together.

As shown in FIG. 6, the light shield LS is initially formed on the support substrate 5. The light shield LS is formed in the first area AR1 of the first substrate SUB1. By applying an organic insulating film on the support substrate 5 and the light shield LS, a first insulating substrate 10 is formed. Then, the first insulating film 11, second insulating film 12, third insulating film 13, pad electrode PD, signal line 6, fourth insulating film 14, and first alignment film AL1 are formed one after another to form the first substrate SUB1. On the other hand, the second substrate SUB2 is formed.

Then, the sealant SL is formed on the first substrate SUB1 and the second substrate SUB2, and a liquid crystal material is dropped inside the area surrounded by the sealant SL. Then, the first substrate SUB1 and the second substrate SUB2 are adhered together.

Then, laser LL is irradiated from the rear surface side of the support substrate 5 to partly peel the support substrate 5 from the first insulating substrate 10. Here, in the present embodiment, the support substrate 5 is formed of glass and the first insulating substrate 10 is formed of polyimide. The laser LL irradiated from the rear surface side of the support substrate 5 reaches the surface 10A of the first insulating substrate 10 in the second area AR2. The first insulating substrate 10 absorbs and resolves the laser LL at the interface between the support substrate 5 and the first insulating substrate 10. Thereby, a space is created at the interface between the support substrate 5 and the first insulating substrate 10. At that time, the laser LL does not reach the surface 10A of the first insulating substrate 10 by the light shield LS in the first area AR1, and thus, the interface between the first insulating substrate 10 and the light shield LS is not peeled off.

Figure 7:
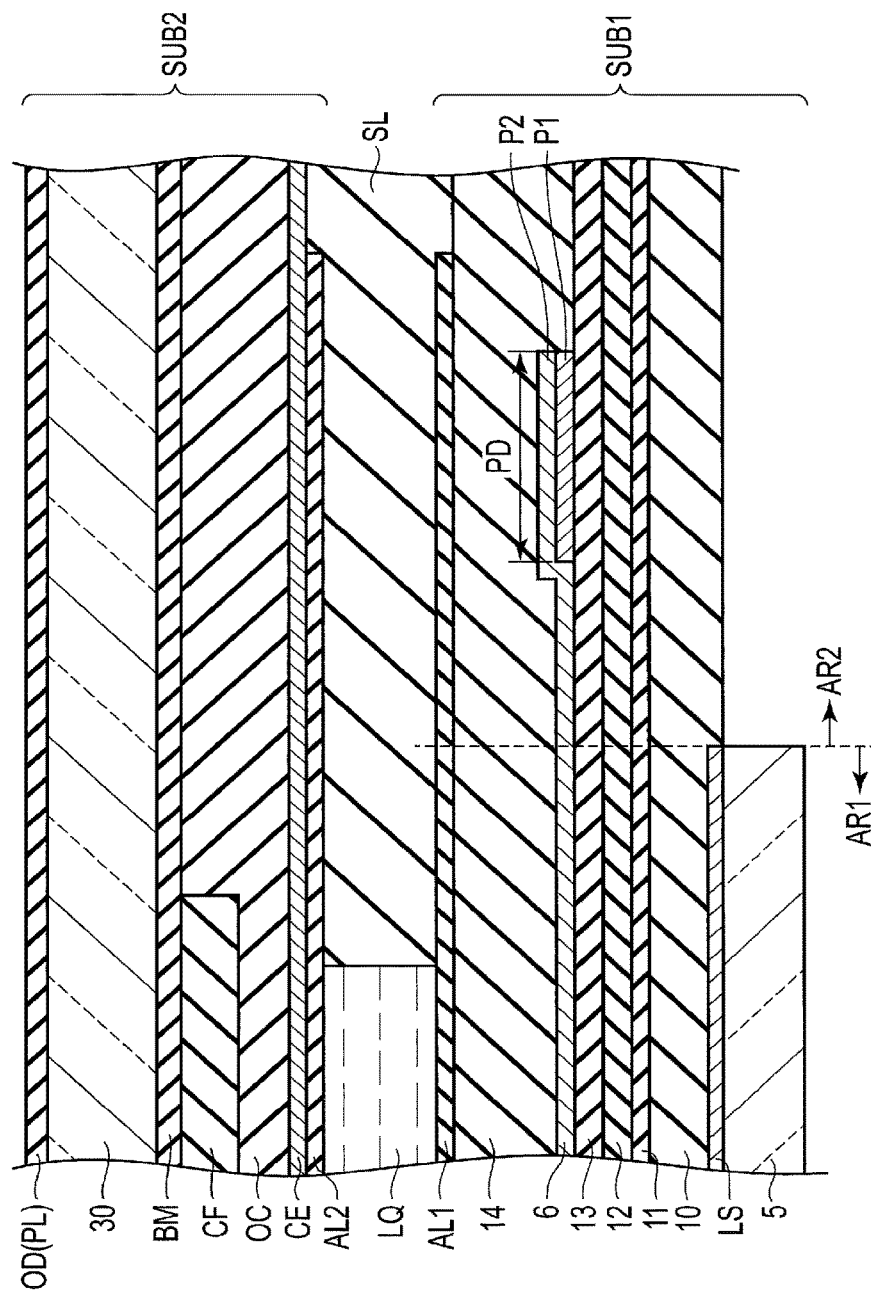
FIG. 7 is a cross-sectional view showing a second process in which the support substrate is partly peeled off from the first insulating substrate after the first process of FIG. 6.

FIG. 7 is a cross-sectional view showing a second process in which the support substrate 5 is partly peeled off from the first insulating substrate 10 after the first process of FIG. 6.

As shown in FIG. 7, after the laser irradiation, the support substrate 5 is fixed to the first insulating substrate 10 through the light shield LS in the first area AR1 while the support substrate 5 is detached from the first insulating substrate 10 in the second area AR2. Then, the support substrate 5 is cut at the boundary between the first area AR1 and the second area AR2 to remove the support substrate 5 from the second area AR2. Note that the position of cutting the support substrate 5 is not limited to the position opposed to the end of the light shield LS. For example, the support substrate 5 may be cut at a position which is apart from the end of the light shield LS and is not opposed to the light shield LS.

FIG. 8 is a cross-sectional view showing a third process in which the contact hole CHa is formed in the first substrate SUB1 after the second process of FIG. 7.

As shown in FIG. 8, after the support substrate 5 is detached from the first insulating substrate in the second area AR2, the contact hole CHa is formed in the first substrate SUB1. Specifically, laser is irradiated from the lower side of the first substrate SUB1 toward the area overlapping the sealant SL, the contact hole CHa is formed through the first insulating film 11, second insulating film 12, third insulating film 13 to reach the contact hole CHa. In the present embodiment, laser with a wavelength of 258 nm or less should be used.

FIG. 9 is a cross-sectional view showing a fourth process in which the line substrate 1 is pressed to the liquid crystal display panel PNL after the third process of FIG. 8.

As shown in FIG. 9, after the formation of the contact hole CHa in the first substrate SUB1, the line substrate 1 is pressed to the liquid crystal display panel PNL using the anisotropy conductive film 3. Specifically, the anisotropy conductive film 3 is disposed between the line substrate 1 and the liquid crystal display panel PNL to be opposed to the contact hole CHa, and a force is applied from the lower side of the line substrate 1 and the upper side of the liquid crystal display panel PNL as shown by arrows in FIG. 9 and heat is applied thereto. Thereby, the anisotropy conductive film 3 melts and permeates into the contact hole CH, and conductive particles included in the anisotropy conductive film 3 contact the pad electrode PD to achieve electrical connection between the line substrate 1 and the liquid crystal display panel PNL.

Through the above processes, the line substrate 1 is firmly adhered to the liquid crystal display panel PNL.

As in the above example, the line substrate 1 and the liquid crystal display panel PNL are adhered and connected together in the second area AR2. Since a contact hole CHa is formed in the second area AR2 for the electrical connection between the line substrate 1 and the liquid crystal display panel PNL, the support substrate 5 needs to be peeled off in the second area AR2.

In the present embodiment, the liquid crystal display panel PNL includes the light shield LS disposed between the support substrate 5 and the first insulating substrate 10. The light shield LS is disposed in the first area AR1 of the first substrate SUB1. Thus, there is no need of an additional external member to shield the laser which is disposed to correspond to the liquid crystal display panel PNL to peel off the support substrate 5 of the second area AR2 from the first insulating substrate 10. Therefore, the light shield LS used to peel off the support substrate 5 in the second area AR2 can be disposed in a more accurate position. Furthermore, the production cost can be reduced since no additional laser shielding member is required.

Furthermore, since the support substrate 5 is disposed in the first area AR1, the strength of the liquid crystal display panel PNL can be maintained even if the first insulating substrate 10 is formed very thin. Furthermore, the support substrate 5 can suppress moisture permeation to the internal structure from the outside of the liquid crystal display panel PNL even if the first insulating substrate 10 is formed of an organic insulating film such as polyimide which is relatively permeable.

Furthermore, in the present embodiment, the display device DSP includes the line substrate 1 disposed below the liquid crystal display panel PNL (in the rear surface side which is opposite to the display surface) wherein the line substrate 1 and the liquid crystal display panel PNL are electrically connected through the conductive material (anisotropy conductive film 3 in the above example) in the contact hole CH in the second area AR2. Furthermore, the driver 2 is disposed below the liquid crystal display panel PNL. Since the area of the first substrate SUB1 is not required to be enlarged to mount the driver 2 or the line substrate 1 thereon, the first substrate SUB1 and the second substrate SUB2 can be formed substantially even. Furthermore, in the area where the first substrate SUB1 and the second substrate SUB2 are opposed to each other, the active area ACT can be increased. That is, in the display surface of the display device DSP of the present embodiment, the area of the active area ACT used for display can be increased, and a thinner bezel structure can be achieved.

Furthermore, since there is no need of a long flexible printed circuit used for the electrical connection between the part of the first substrate SUB1 which is opposed to the second substrate SUB2 and the line substrate 1, or a space to accommodate a bent flexible printed circuit, the display device DSP can be miniaturized. Furthermore, an electronic device including the display device DSP can be miniaturized, too.

Furthermore, since a possible breakdown of the lines when the flexible printed circuit is bent can be avoided, the display device DSP can be more reliable.

Furthermore, the contact hole CHa is formed to be opposed to the sealant SL. Since the sealant SL includes a solid substance such as fiber, a bezel area PRP including the sealant SL can be formed stronger with respect to a force in the third direction Z of the liquid crystal display panel PNL as compared to the active area ACT. That is, when the line substrate 1 is pressed to the liquid crystal display panel PNL, damage to the liquid crystal display panel PNL caused of the force in the third direction Z can be suppressed.

Now, a variation of the present embodiment will be explained.

FIG. 10 is a cross-sectional view of a variation of the display device DSP of the present embodiment. In the example of FIG. 10, the display device is an organic electroluminescent display device.

Initially, the structure of the display device in a display element part 120 will be explained. Note that elements structured the same as those of the above example will be referred to by the same reference numbers and detailed description thereof will be omitted.

As in FIG. 10, the first substrate SUB1 includes, for example, a support substrate 5, light shield LS, first insulating substrate 10, switching elements SW1, SW2, and SW3, and organic electroluminescent (EL) elements OLED1, OLED2, and OLED3. The light shield LS is disposed between the support substrate 5 and the first insulating substrate 10. Switching elements SW1 to SW3 are formed on the first insulating film 11. The reflective layer 4 is formed on the fourth insulating film 14.

Organic EL elements (light emitting elements) OLED1 to OLED3 are disposed between the first substrate SUB1 and the second substrate SUB2. Furthermore, the organic EL elements OLED1 to OLED3 are formed on the fourth insulating film 14. In the example depicted, the organic EL element OLED1 is electrically connected to the switching element SW1, the organic EL element OLED2 is electrically connected to the switching element SW2, and the organic EL element OLED3 is electrically connected to the switching element SW3. Each of the organic EL elements OLED1 to OLED3 is structured as a top-emission type which emits whit light toward the second substrate SUB2. The organic EL elements OLED1 to OLED3 have the same structure.

The organic EL elements OLED1 includes a positive electrode PE1 formed on the reflective layer 4. The positive electrode PE1 contacts the drain electrode WD of the switching element SW1 and is electrically connected to the switching element SW1. Similarly, the organic EL element OLED2 includes a positive electrode PE2 which is electrically connected to the switching element SW2 and the organic EL element OLED3 includes a positive electrode PE3 which is electrically connected to the switching element SW3.

The organic EL elements OLED1 to OLED3 each include an organic light emitting layer ORG and a common electrode (negative electrode) CE. The organic light emitting layer ORG is disposed to correspond to each of the positive electrodes PE1 to PE3. The common electrode CE is positioned above the organic light emitting layer ORG. In the example depicted, the organic EL elements OLED1 to OLED3 are defined by ribs 15. Note that, although this is not depicted, each of the organic EL elements OLED1 to OLED3 is, preferably, sealed by a transparent shielding film.

The display element part 120 is an area of the first substrate SUB1 in which a plurality of switching elements and organic EL elements OLED are arranged, and thus, the display element part 120 is a substantial display area for the image display.

The second substrate SUB2 includes a color filter layer 220 and the like on the inner surface 30A side of the second insulating substrate 30. The color filter layer 220 includes color filters CF1, CF2, and CF3. The color filter CF1 is opposed to the organic EL element OLED1 and is a blue color filter which passes blue wave length light in white light. The color filter CF2 is opposed to the organic EL element OLED2 and is a green color filter which passes green wave length light in white light. The color filter CF3 is opposed to the organic EL element OLED3 and is a red color filter which passes red wave length light in white light.

The first substrate SUB1 and the second substrate SUB2 are adhered by a transparent adhesive layer 41. Note that the support substrate 5 and the light shield LS are disposed to overlap the adhesive layer 41 in a plan view. Furthermore, the adhesive layer 41 is disposed to cross over the boundary between the first area AR1 and the second area AR2.

In the above display device, when the organic EL elements OLED1 to OLED3 emit light, the light (white light) irradiated from the elements OLED1 to OLED3 exits through the color filters CF1, CF2, and CF3. Therein, the light of blue wave length in the white light irradiated from the organic EL element OLED1 passes the color filter CF1. Additionally, the light of green wave length in the white light irradiated from the organic EL element OLED2 passes the color filter CF2, and the light of red wave length in the white light irradiated from the organic EL element OLED3 passes the color filter CF3. Therefore, color image display can be achieved.

Now, the structure of the display device in a bezel area PRP will be explained.

The first substrate SUB1 includes, for example, the support substrate 5, light shield LS, first insulating substrate 10, pad electrode PD, and signal line 6. A contact hole CHb is formed to pass through the first insulating substrate 10, first insulating film 11, second insulating film 12, and third insulating film 13 to reach the pad electrode PD. The contact hole CHb corresponds to a through hole. The signal line 6 is disposed on the third insulating film 13 in the same layer in which the pad electrode PD is disposed. The line substrate 1 is disposed in the rear surface side of the first substrate SUB1. The pad electrode PD and the connection line 100 of the line substrate 1 are electrically connected to each other through the anisotropy conductive film 3. Note that the contact hole CHb is formed in a position to overlap the adhesive layer 41.

The same advantages as in the above embodiment can be achieved by the organic EL display device which is a variation of the display device of the above embodiment.

Figure 11:
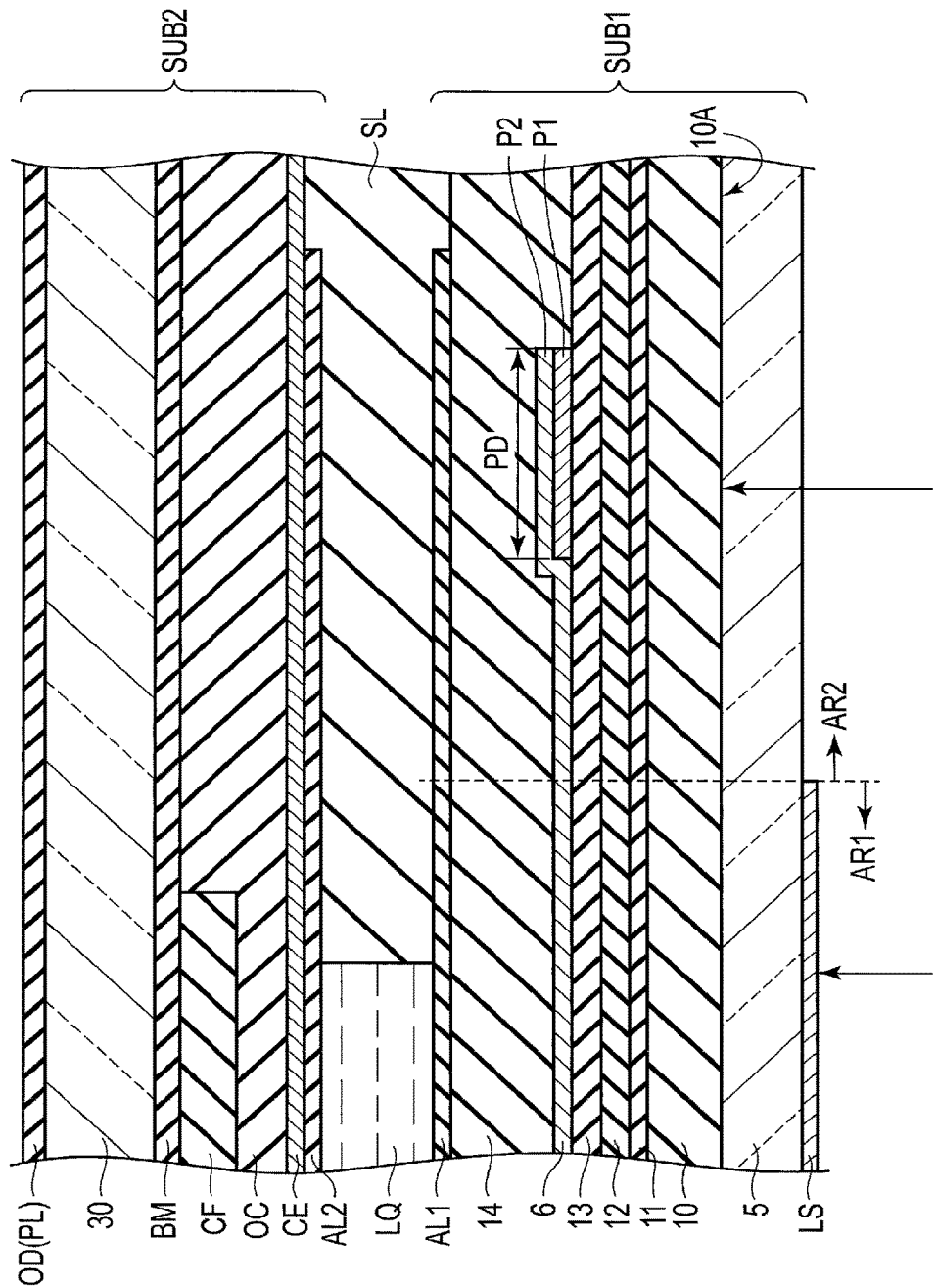
FIG. 11 is a cross-sectional view of a variation of the first process of FIG. 6.

FIG. 11 is a cross-sectional view of a variation of the first process of FIG. 6.

The liquid crystal display panel PNL of FIG. 11 includes the light shield LS disposed below the support substrate 5. In this respect, the liquid crystal display panel PNL of FIG. 11 differs from that of FIG. 6.

Here, as in the first process of FIG. 6, laser LL is irradiated from the rear surface side of the support substrate 5 to partly peel off the support substrate 5 from the first insulating substrate 10. At that time, the laser LL does not reach the surface 10A of the first insulating substrate 10 by the light shield LS in the first area AR1, and thus, the support substrate 5 and the first insulating substrate 10 are not detached from each other at the interface therebetween. In the second area AR2, the laser LL reaches the surface 10A of the first insulating substrate 10, and thus, the support substrate 5 and the first insulating substrate 10 are detached from each other at the interface therebetween.

Figure 12:
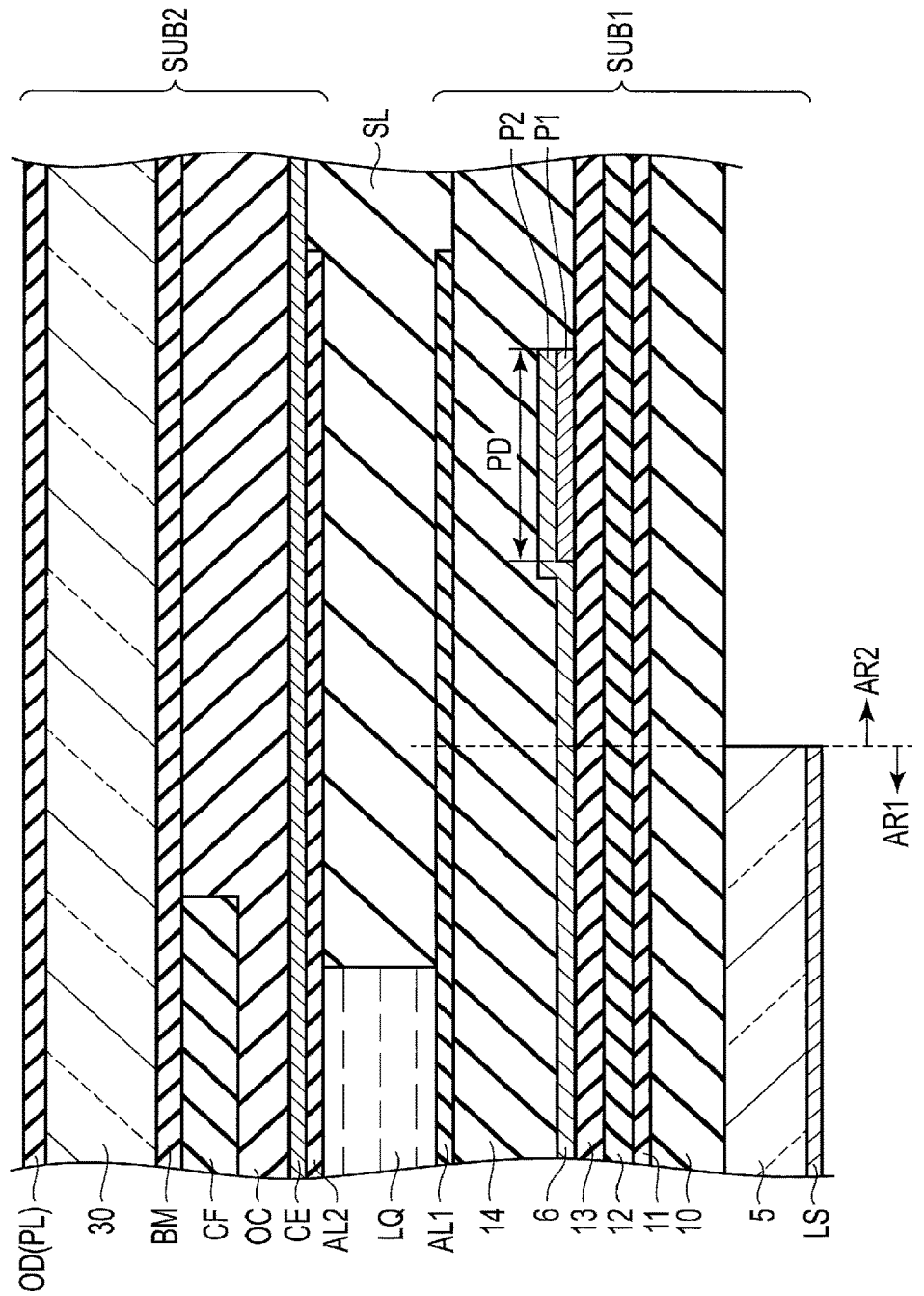
FIG. 12 is a cross-sectional view of a variation of the second process of FIG. 7.

FIG. 12 is a cross-sectional view of a variation of the second process of FIG. 7. The process of FIG. 12 follows the process of FIG. 11.

As shown in FIG. 12, after the irradiation of laser, the support substrate 5 in the first area AR1 is fixed to the first insulating substrate 10 while the support substrate 5 in the second area AR2 is floated from the first insulating substrate 10. Then, for example, the support substrate 5 in the second area AR2 is removed by cutting the support substrate 5 at the boundary of the first area AR1 and the second area AR2. As above, even if the light shield LS is disposed below the support substrate 5, the support substrate 5 can partly be peeled off the first insulating substrate 10.

Figure 13:
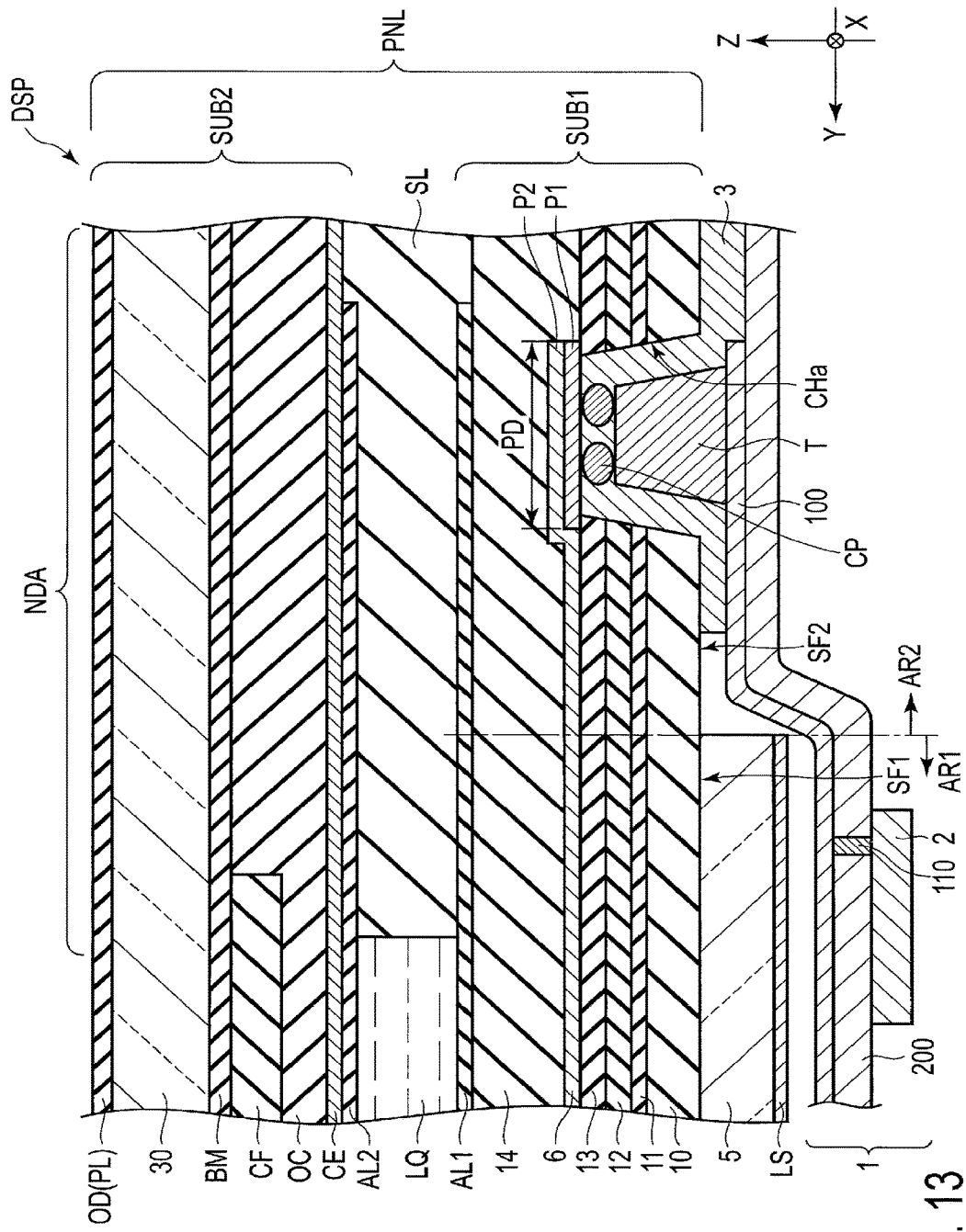
FIG. 13 is a cross-sectional view of a variation of the display device of the embodiment.

FIG. 13 is a cross-sectional view of a variation of the display device DSP of the embodiment. The liquid crystal display panel PNL of FIG. 13 includes the light shield LS disposed below the support substrate 5. In this respect, the liquid crystal display panel PNL of FIG. 13 differs from the liquid crystal display panel PNL of FIG. 4. That is, FIG. 13 shows a condition of the display device DSP after the steps of FIGS. 11 and 12, in which the contact hole CHa is formed in the first substrate SUB1 and the line substrate 1 is pressed and fixed to the liquid crystal display panel PNL.

The lower surface SF1 of the first insulating substrate 10 in the first area AR1 and the lower surface SF2 of the first insulating substrate 10 in the second area AR2 are disposed on the same flat surface in the X-Y plane. Furthermore, the lower surface SF1 contacts the first insulating substrate 10 and the lower surface SF2 contacts the anisotropy conductive film 3.

As can be understood from the above, the present embodiment can achieve a compact and thin-bezel display device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. display device, comprising:
a support substrate;
an insulating substrate above the support substrate, the insulating substrate including a through hole;
a light shield between the support substrate and the insulating substrate, the light shield in contact with the support substrate and the insulating substrate;
a pad electrode above the insulating substrate and corresponding to the through hole;
a signal line above the insulating substrate and electrically connected to the pad electrode; and
a line substrate including a connection line, wherein
the line substrate is below the support substrate,
the display device includes, in a plan view, a first area and a second area, the first area corresponding to a display area and the second area corresponding to a non-display area,
the insulating substrate is in both the first area and the second area,
the through hole and the pad electrode are in the second area such that a part of the second area is on either side of the through hole and the pad electrode, the support substrate and the light shield are in the first area and not in the second area, the insulating substrate and the line substrate are connected to each other in the second area, and the pad electrode and the connection line are electrically connected to each other.

2. The display device of claim 1, wherein the insulating substrate has a thickness in the first area which is less than that in the second area.

3. The display device of claim 1, further comprising:

a conductive material is inside the through hole to electrically connect the pad electrode and the connection line, wherein a first lower surface of the insulating substrate in the first area contacts the light shield, and a second lower surface of the insulating substrate in the second area contacts the conductive material.

4. The display device of claim 3, wherein the pad electrode includes a first electrode contacting the conductive material, and the first electrode is formed of a transparent conductive layer.

5. The display device of claim 4, wherein the pad electrode includes a second electrode on the first electrode, and the second electrode is formed of a metal material.

6. The display device of claim 1, wherein a first lower surface of the insulating substrate in the first area and a second lower surface of the insulating substrate in the second area are on the same plane.

7. The display device of claim 1, wherein the light shield is formed of a metal material.

8. The display device of claim 1, further comprising:

a first substrate above the support substrate and opposed to the support substrate;

a light emitting element between the first substrate and the support substrate; and an adhesive layer which adheres the first substrate and the support substrate.

9. The display device of claim 8, wherein the adhesive layer bridges the first area and the second area over a boundary therebetween.

10. The display device of claim 1, further comprising:

a first substrate above the support substrate and opposed to the support substrate;

a liquid crystal layer held between the first substrate and the support substrate; and a sealant which adheres the first substrate and the support substrate.

11. The display device of claim 10, wherein the sealant is, in the plan view, formed in a position overlapping the through hole.

12. The display device of claim 10, wherein the sealant bridges the first area and the second area over a boundary therebetween.

13. The display device of claim 1, wherein the insulating substrate is formed of polyimide.

* * * * *